(12) United States Patent
Hanada et al.

(10) Patent No.: US 12,224,332 B2
(45) Date of Patent: Feb. 11, 2025

(54) SEMICONDUCTOR DEVICE

(71) Applicant: Japan Display Inc., Tokyo (JP)

(72) Inventors: Akihiro Hanada, Tokyo (JP); Takuo Kaitoh, Tokyo (JP); Hajime Watakabe, Tokyo (JP)

(73) Assignee: Japan Display Inc., Tokyo (JP)

( * ) Notice: Subject to any disclaimer, the term of this patent is extended or adjusted under 35 U.S.C. 154(b) by 384 days.

(21) Appl. No.: 17/657,168

(22) Filed: Mar. 30, 2022

(65) Prior Publication Data
US 2022/0223707 A1    Jul. 14, 2022

Related U.S. Application Data

(63) Continuation of application No. PCT/JP2020/035034, filed on Sep. 16, 2020.

(30) Foreign Application Priority Data

Oct. 2, 2019 (JP) .................. 2019-181794

(51) Int. Cl.
| | |
|---|---|
| *H01L 29/49* | (2006.01) |
| *G02F 1/1368* | (2006.01) |
| *H01L 27/12* | (2006.01) |
| *H01L 29/786* | (2006.01) |

(52) U.S. Cl.
CPC ........ *H01L 29/4908* (2013.01); *G02F 1/1368* (2013.01); *H01L 27/1225* (2013.01); *H01L 29/78621* (2013.01); *H01L 29/7869* (2013.01)

(58) Field of Classification Search
CPC ......... H01L 29/78669; H01L 29/78678; H01L 29/66765; H01L 29/78048; H01L 29/7869–78693; H01L 29/4908; H01L 27/1225; H01L 29/78621; H01L 29/42384;

(Continued)

(56) References Cited

U.S. PATENT DOCUMENTS

| | | | |
|---|---|---|---|
| 2002/0079501 A1* | 6/2002 | Okada | .................. G02F 1/1362 257/E21.414 |
| 2006/0110871 A1* | 5/2006 | Gan | .................. H01L 29/66765 257/E21.414 |
| 2015/0091004 A1* | 4/2015 | Kim | ...................... H01L 27/124 257/43 |

FOREIGN PATENT DOCUMENTS

| | | | | |
|---|---|---|---|---|
| CN | 102651402 A | * | 8/2012 | ............ H01L 29/45 |
| JP | 6-291119 A | | 10/1994 | |
| JP | 2012-43821 A | | 3/2012 | |

OTHER PUBLICATIONS

International Search Report issued Dec. 8, 2020 in PCT/JP2020/035034 filed Sep. 16, 2020, 2 pages.

* cited by examiner

*Primary Examiner* — Ermias T Woldegeorgis
(74) *Attorney, Agent, or Firm* — Maier & Maier, PLLC (57) ABSTRACT

The purpose of the present invention is to suppress a change in characteristics of a TFT using an oxide semiconductor film caused by that oxygen in the oxide semiconductor film is extracted by metal electrode. The main structure of the present invention is as follows. A semiconductor device having a TFT, in which a gate insulating film is formed on a gate electrode, and an oxide semiconductor film is formed on the gate insulating film; the oxide semiconductor film including a channel region, a drain region, and a source region; in which a metal nitride film is formed on a top surface of the gate electrode in an opposing portion to the channel region in a plan view; and the metal nitride film is not formed at a part of the top surface of the gate electrode.

12 Claims, 12 Drawing Sheets

(58) Field of Classification Search
CPC ......... H01L 29/78618; H01L 29/78609; G02F 1/1368
See application file for complete search history.

SEMICONDUCTOR DEVICE

The present application is a continuation application of International Application No. PCT/JP2020/035034, filed on Sep. 16, 2020, which claims priority to Japanese Patent Application No. 2019-181794, filed on Oct. 2, 2019. The contents of these applications are incorporated herein by reference in their entirety.

BACKGROUND OF THE INVENTION

(1) Field of the Invention

The present invention relates to a semiconductor device including a display device and an optical sensor device using a TFT made of an oxide semiconductor.

(2) Description of the Related Art

A TFT (Thin Film Transistor) including an oxide semiconductor has larger OFF resistance compared with a TFT including a poly silicon semiconductor, and has a higher mobility compared with a TFT including a a-Si (Amorphous silicon) semiconductor; therefore, it can be used in a display device such as a liquid crystal display device and an organic EL display device and so forth, or in semiconductor devices as sensors and so forth.

In a semiconductor device using a TFT, an aluminum (Al) wiring is often used for a drain electrode, a source electrode of a TFT, and a video signal line, a scanning line, and the like. This is because the wiring resistance can be reduced. However, the Al wiring tends to be broken due to electromigration or stress migration. In order to prevent this, Patent document 1 discloses to form titanium nitride (TiN) around an Al wiring.

In addition, in the above-described semiconductor device, ITO (Indium Tin Oxide) film which is a transparent metal oxide conductive film is used together with an Al wiring. When the ITO film and Al wiring are directly connected, Al deprives the oxygen of ITO and the Al wiring and the ITO film cannot electrically connect. In order to prevent this, in the comparative example of Patent Document 2, an Al wiring has a three layer structure of Ti, Al, and TiN.

PRIOR ART REFERENCE

Patent Document

[Patent document 1] Japanese patent application publication Hei 6-291119
[Patent document 2] Japanese patent application publication 2012-43821

SUMMARY OF THE INVENTION

When oxygen is removed, an oxide semiconductor becomes metallized and becomes conductive. Further, in a TFT including an oxide semiconductor, when oxygen is removed from a channel region, a TFT becomes conductive, and the operation as a TFT becomes impossible.

On the other hand, in a semiconductor device using a TFT, a metal is used for a gate electrode, a drain electrode, a source electrode, and the like of a TFT. Metals have the property of depriving oxygen. In the bottom-gate oxide semiconductor TFT, a gate insulating film is present on the gate electrode, and an oxide semiconductor film is provided on the gate insulating film. In such a configuration, a phenomenon occurs in which the gate electrode, which is a metal, deprives the oxide semiconductor of oxygen via the gate insulating film, and the oxide semiconductor TFT does not operate.

An object of the present invention is to prevent a phenomenon in which an oxide semiconductor TFT does not operate, in particular, when oxygen is removed from a channel region of the oxide semiconductor.

The present invention solves the above problems, and the main specific means thereof are as follows.

(1) A semiconductor device having a TFT, in which a gate insulating film is formed on a gate electrode, and an oxide semiconductor film is formed on the gate insulating film; the oxide semiconductor film including a channel region, a drain region, and a source region; in which a metal nitride film is formed on a top surface of the gate electrode in an opposing portion to the channel region in a plan view; and the metal nitride film is not formed at a part of the top surface of the gate electrode.

(2) A semiconductor device having a TFT, in which a gate insulating film is formed on a gate electrode, and an oxide semiconductor film is formed on the gate insulating film; the oxide semiconductor film includes a channel region, a drain region, and a source region; in which a metal oxide film is formed on a top surface of the gate electrode in an opposing portion to the channel region in a plan view, and the metal oxide film is not formed at a part of the top surface of the gate electrode.

(3) A semiconductor device having a TFT, in which a gate insulating film is formed on a gate electrode, and an oxide semiconductor film is formed on the gate insulating film; the oxide semiconductor film includes a channel region, a drain region, and a source region; in which an insulating metal oxide film is formed on a top surface of the gate electrode in an opposing portion to the channel region in a plan view, and the metal oxide film is not formed at a part of the top surface of the gate electrode.

DETAILED DESCRIPTION OF THE PREFERRED EMBODIMENTS

Figure 1:
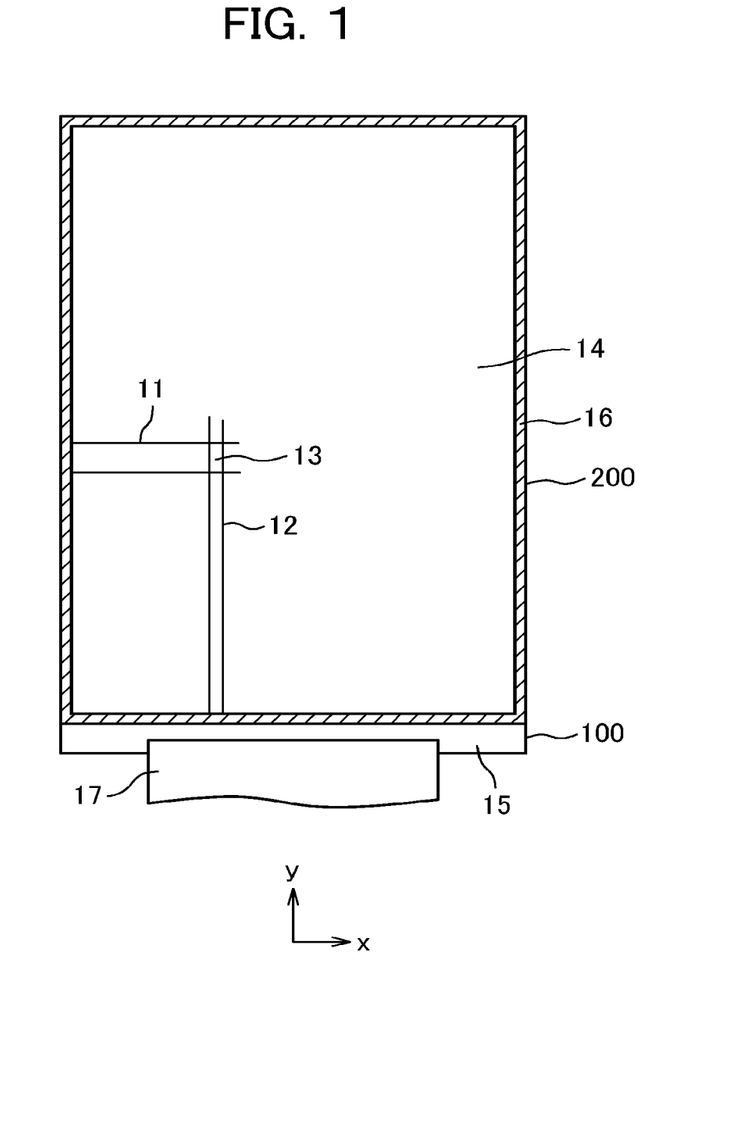
FIG. 1 is a plan view of a liquid crystal display device.

Hereinafter, the contents of the present invention will be described in detail by taking a liquid crystal display device as an example. FIG. 1 is a plan view of an exemplary liquid crystal display device to which the present invention is applied. In FIG. 1, the TFT substrate 100 and the counter substrate 200 are bonded together by a sealant 16, and a liquid crystal layer is sandwiched between the TFT substrate 100 and the counter substrate 200. A display region 14 is formed at a portion where the TFT substrate 100 and the counter substrate 200 overlap each other.

In the display region 14 of the TFT substrate 100, scanning lines 11 extend in the horizontal direction (x-direction) and are arranged in the vertical direction (y-direction). Further, the video signal lines 12 extend in the vertical direction and are arranged in the horizontal direction. A region surrounded by the scanning line 11 and the video signal line 12 becomes a pixel 13.

The TFT substrate 100 is formed larger than the counter substrate 200, and a portion where the TFT substrate 100 does not overlap with the counter substrate 200 is a terminal region 15. A flexible wiring board 17 is connected to the terminal region 15. A driver IC for driving a liquid crystal display device is mounted on a flexible wiring board 17.

Since the liquid crystal does not emit light, a backlight is disposed on the back surface of the TFT substrate 100. A liquid crystal display panel forms an image by controlling light from a backlight for each pixel. The flexible wiring board 17 is bent on the back surface of the backlight so as to reduce the overall outer shape of the liquid crystal display device.

In the liquid crystal display device of the present invention, a TFT using an oxide semiconductor, which has a small leakage current, is used in the display region 14. For example, a scanning line driving circuit is formed in a frame portion near a sealing material, and a TFT using a polysilicon semiconductor, which has a high mobility, is often used for the scanning line driving circuit, but a TFT using an oxide semiconductor can also be used.

Figure 2:
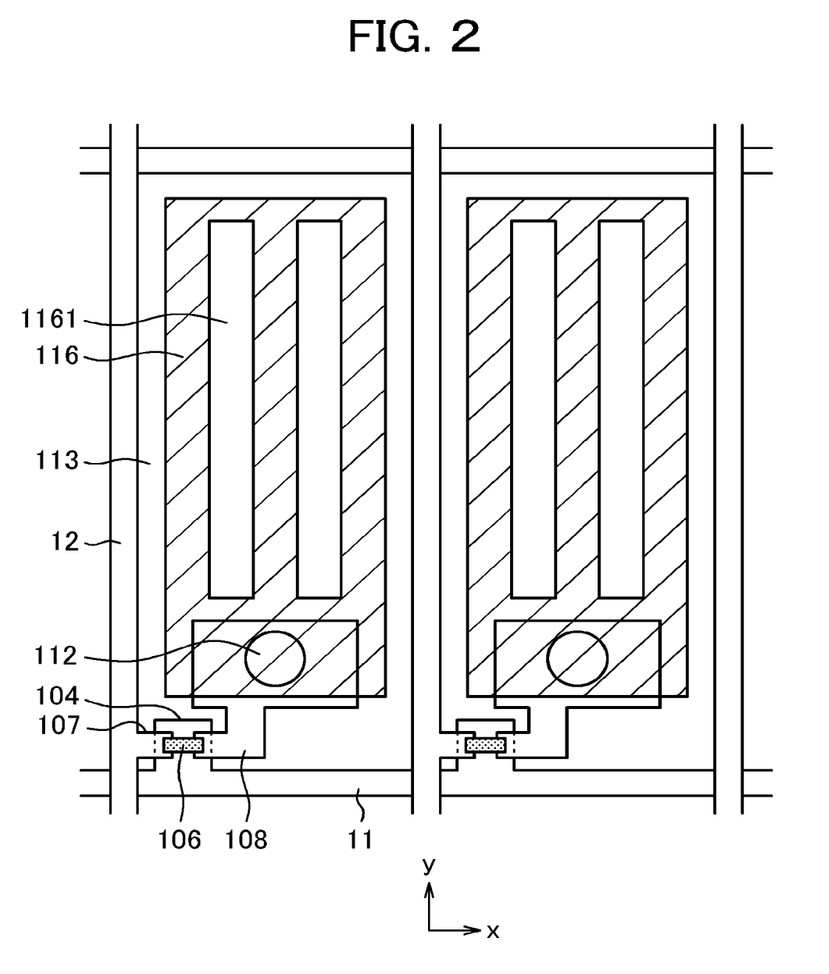
FIG. 2 is a plan view of the display area of a liquid crystal display device.

FIG. 2 is a plan view of a pixel in a display region. FIG. 2 is a liquid crystal display device of a system called FFS (Fringe Field Switching) in an IPS (In Plan Switching) system. In FIG. 2, a bottom-gate TFT including an oxide semiconductor 106 is used. Since the oxide semiconductor TFT has a small leakage current, it is suitable as a switching TFT.

In FIG. 2, the scanning lines 11 extend in the horizontal direction (x-direction) and are arranged in the vertical direction (y-direction). Further, the video signal lines 12 extend in the vertical direction and are arranged in the horizontal direction. A pixel electrode 116 is formed in an area surrounded by the scanning line 11 and the video signal line 12. In FIG. 2, an oxide semiconductor TFT including an oxide semiconductor 106 is formed between a video signal line 12 and a pixel electrode 116. In an oxide semiconductor TFT, a video signal line 12 constitutes a drain electrode 107, and a scanning line 11 branches to form a gate electrode 104 of an oxide semiconductor TFT. The source electrode 108 of the oxide semiconductor TFT extends toward the pixel electrode 116 and is connected to the pixel electrode 116 via the through hole 112.

The pixel electrode 116 is formed in a comb shape. The pixel electrode 116 has a slit 1161. Below the pixel electrode 116, a common electrode 113 is formed in a planar shape with a capacitance insulating film interposed therebetween. The common electrode 113 is formed in common to each pixel. When a video signal is supplied to the pixel electrode 116, an electric line of force passing through the liquid crystal layer is generated between the pixel electrode 116 and the common electrode 113, and an image is formed by rotating the liquid crystal molecules.

Figure 3:
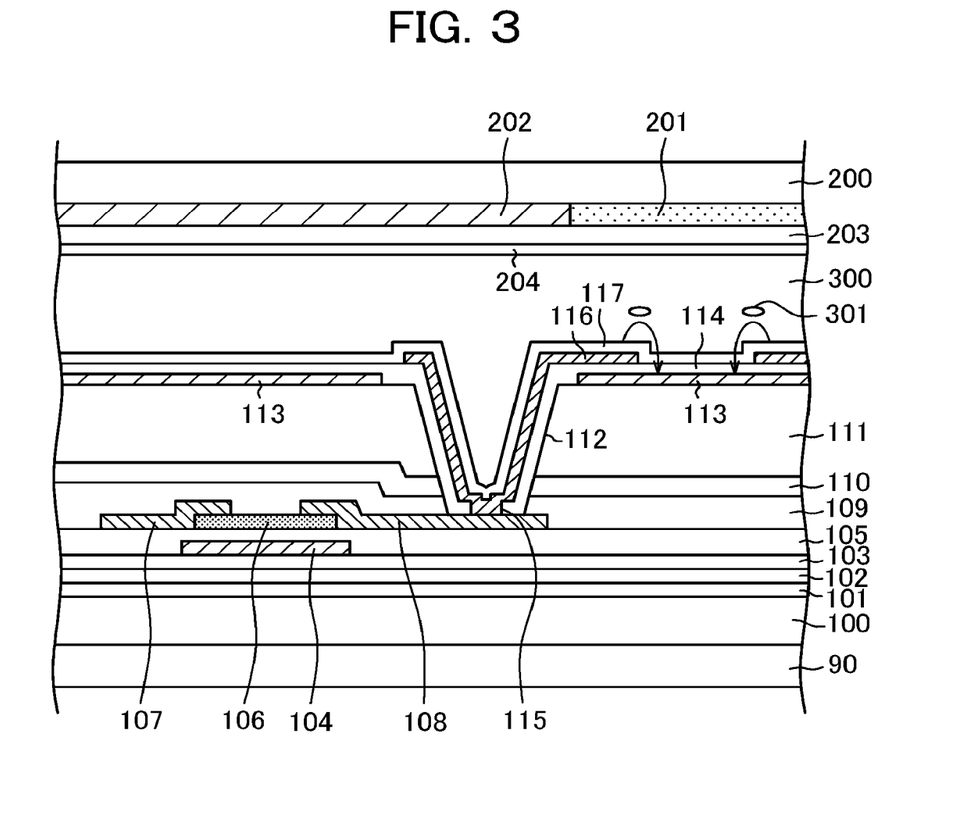
FIG. 3 is a cross sectional view of the display area of a liquid crystal display device.

FIG. 3 is an example of a cross-sectional view of the liquid crystal display device corresponding to FIG. 2. In FIG. 3, a bottom-gate TFT including an oxide semiconductor film 106 is used. Since the oxide semiconductor TFT has a small leakage current, it is suitable as a switching TFT.

Examples of the oxide semiconductor include IGZO (Indium Gallium Zinc Oxide), ITZO (Indium Tin Zinc Oxide), ZnON (Zinc Oxide Nitride), IGO (Indium Gallium Oxide), and so forth. In this embodiment, IGZO is used as an oxide semiconductor.

In FIG. 3, a polyimide substrate 100 is formed on a glass substrate 90. At the end of the process, when the glass substrate 90 is peeled off from the polyimide substrate 100, the liquid crystal display device becomes a flexible liquid crystal display device. On a polyimide substrate 100, a base film constituted from three layers of, a first base film 101 formed of silicon oxide (SiO), a second base film 102 made of silicon nitride (SiN), and a third base film 103 made of silicon oxide (SiO), is formed.

A gate electrode 104 is formed on the third base film 103. The gate electrode 104 has a stacked structure of Ti and Al. A gate insulating film 105 is formed of SiO covering the gate electrode 104, and an oxide semiconductor film 106 is formed over the gate insulating film 105. A drain electrode 107 is stacked on one end of the oxide semiconductor film 106, and a source electrode 108 is stacked on the other end of the oxide semiconductor 106. Each the drain electrode 107 and the source electrode 108 is formed of metal or an alloy.

A first interlayer insulating film 109 made of SiO is formed so as to cover the oxide semiconductor 106, the drain electrode 107, and the source electrode 108, and a second interlayer insulating film 110 made of SiN is formed thereon. The first interlayer insulating film 109 is formed of SiO to supply oxygen from SiO to the channel region of the oxide semiconductor 106.

An organic passivation film 111 is formed of an acrylic resin, for example, on the second interlayer insulating film 110. Since the organic passivation film 111 serves as a planarization film, it is formed as thick as about 2 μm. In the organic passivation film 111, a through hole 112 is formed in order to establish conduction between the source electrode 108 and the pixel electrode 116.

A common electrode 113 is formed in a planar shape on an organic passivation film 111, a capacitor insulating film 114 is formed thereon, and a pixel electrode 116 is formed thereon. In order to establish conduction between the pixel electrode 116 and the source electrode 108, a through hole 115 is formed in the through hole 112 of the organic passivation film 111 in the capacitance insulating film 114. An alignment film 117 for initial alignment of liquid crystal molecules is formed covering the pixel electrode 116.

A counter substrate 200 is disposed opposite to the pixel electrode 116 and the like with the liquid crystal layer 300 interposed therebetween. A color filter 201 and a black matrix 202 are formed inside the counter substrate 200. The black matrix 202 covers the TFT and the through hole 112 and prevents light leakage. An overcoat film 203 is formed covering a color filter 201 and a black matrix 202, and an alignment film 204 is formed thereon.

In FIG. 3, when a voltage is applied to the pixel electrode 116, electric lines of force passing through the liquid crystal layer 300 are generated, thereby rotating the liquid crystal molecules 301 and changing the light transmittance of the liquid crystal layer 300. An image is formed by changing the light transmittance of the liquid crystal layer 300 for each pixel.

As shown in FIG. 3, a gate electrode 104 formed of metal faces the oxide semiconductor 106 with the gate insulating film 105 interposed therebetween. Since the gate electrode 104 is made of metal, oxygen is extracted from the oxide semiconductor 106 through the gate insulating film 105. Then, the resistance of the oxide semiconductor 106 decreases, and the TFT does not operate normally.

Figure 19:
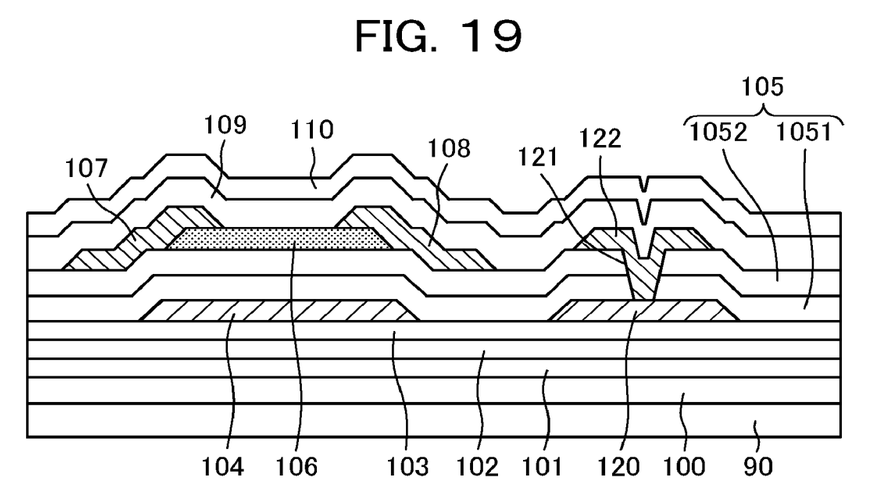
FIG. 19 is a cross sectional view of a TFT and its vicinity according to a comparative example.

FIG. 19 is a cross-sectional view of the vicinity of the TFT as a comparative example to cope with this problem. FIG. 19 is a sectional view of the vicinity of the TFT in which the oxide semiconductor 106 is used, and the right side is a capacitance wiring 120 and a capacitance electrode 122, which are formed simultaneously with the TFT, to form a capacitance.

The layer configuration of FIG. 19 is as described in FIG. 3. FIG. 19 differs from FIG. 3 in that a first gate insulating film 1051 formed of SiN and a second gate insulating film 1052 formed of SiO exist as the gate insulating film 105 between the gate electrode 104 and the oxide semiconductor film 106. The SiO film 1052 is in contact with the oxide semiconductor film 106.

Figure 20:
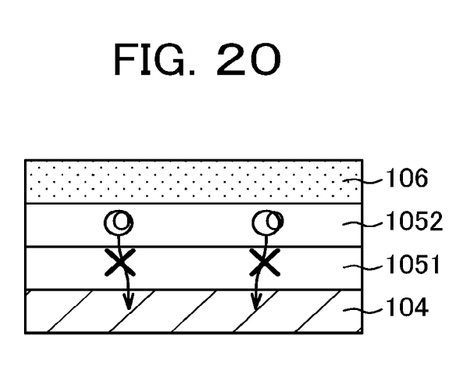
FIG. 20 is a detailed cross sectional view of the comparative example.

FIG. 20 is a cross-sectional view showing an operation of the first gate insulating film 1051 formed of SiN in FIG. 19. The SiN film 1051 has a property of blocking oxygen. In FIG. 20, the gate electrode 104 formed of metal tends to attract oxygen from the SiO film as the second gate insulating film 1052 or the oxide semiconductor film 106. As shown in FIG. 20, it is possible to prevent oxygen from being removed from the oxide semiconductor 106 by blocking oxygen migration by the SiN film serving as the first gate insulating film 1051. The mark X indicated by an arrow in FIG. 20 indicates that oxygen is blocked by the SiN film 1051.

Figure 21:
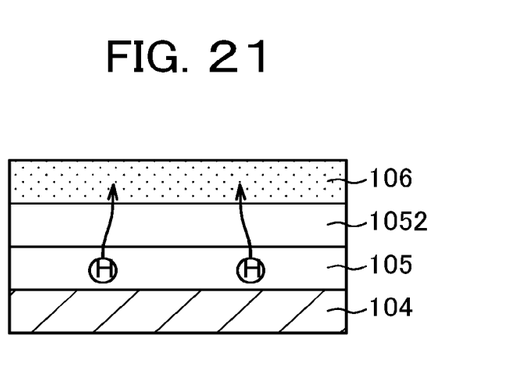
FIG. 21 is another detailed cross sectional view of the comparative example.

FIG. 21 is a cross-sectional view showing a problem of the configuration of FIG. 19. The SiN film constituting the first gate insulating film 1051 blocks oxygen; however, it releases hydrogen. When this hydrogen reaches the oxide semiconductor film 106, the oxide semiconductor is reduced, that is, oxygen is removed, so that the oxide semiconductor film 106 becomes conductive.

Therefore, in the configuration of FIG. 19, sufficient countermeasures are not taken. Embodiments 1 to 4 described below provide a structure that prevents oxygen from being deprived from the oxide semiconductor film 106 while preventing such problems.

Embodiment 1

Figure 4:
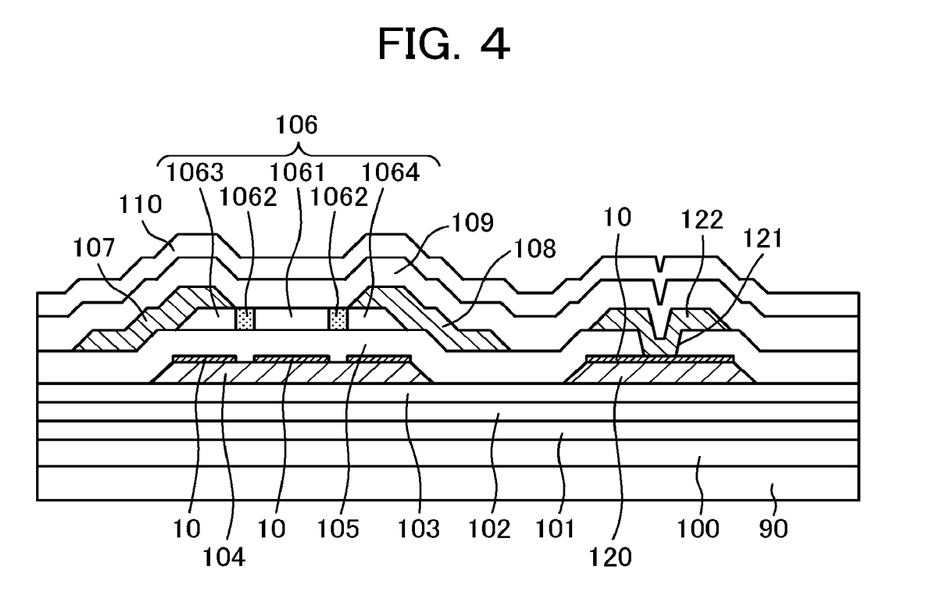
FIG. 4 is a cross sectional view of the structure of a TFT and its vicinity according to a first example of embodiment 1.
Figure 5:
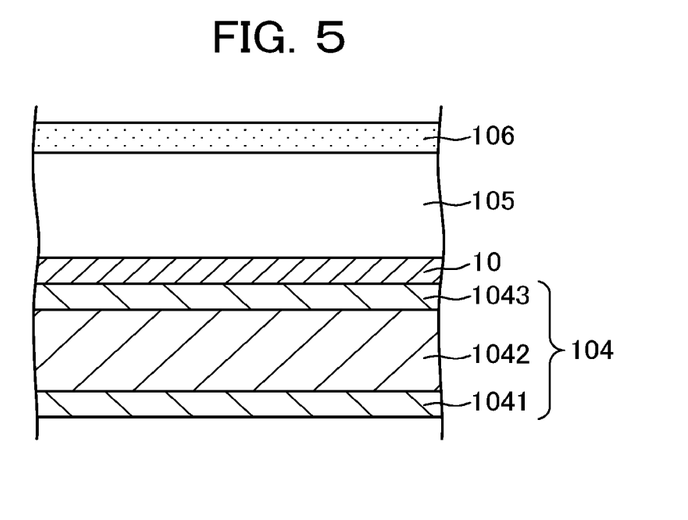
FIG. 5 is an example of a cross-sectional view of the gate electrode according to embodiment 1.

FIG. 4 is a cross-sectional view showing a first example of embodiment 1. The layer configuration of FIG. 4 is similar to that described in FIG. 3. As shown in FIG. 5, the gate electrode 104 has a structure in which an Al film 1042 is sandwiched between a Ti film which is a base metal 1041 and a Ti film which is a cap metal 1043. The feature of FIG. 4 and FIG. 5 is that titanium nitride (TiN) which is a metal nitride film 10 is formed on the gate electrode 104. A gate insulating film 105 made of a SiO film is formed on the titanium nitride film 10, and an oxide semiconductor film 106 is formed over the gate insulating film 105.

Although the titanium nitride film 10 is formed by sputtering, it can be continuously performed in the same chamber as the sputtering of the Ti film which is the cap metal 1043. In other words, after forming the Ti film 1043 by sputtering, a TiN film 10 can be formed by reactive sputtering by introducing nitrogen gas.

A film thicknesses in FIG. 5 are, for example, as follows. A thickness of the base metal is 1041 is 50 nm, a thickness of the Al film 1042 is 300 nm, and a thickness of the cap metal 1043 is 50 nm. A thickness of the TiN film 10 is, for example, 10 nm, but may be about 5 to 30 nm. A thickness of the gate insulating film 105 formed of SiO is, for example, 300 to 500 nm, and a thickness of the oxide semiconductor 106 is, for example, 50 nm. By the way, the base metal 1041 in FIG. 5 may be omitted.

In FIG. 4, the titanium nitride film 10 formed on the gate electrode 104 prevents oxygen from being absorbed into the gate electrode 104 from the oxide semiconductor 106. Accordingly, changing of characteristics of the oxide semiconductor TFT can be avoided.

In FIG. 4, the titanium nitride film 10 is not formed on the entire upper surface of the gate electrode 104, but there are holes in the titanium nitride film 10 on the surface of the gate electrode 104. This hole is used to form an intermediate resistance region (also referred to as an LDD region) 1062 in the oxide semiconductor film 106. That is, in the portion where the hole is formed, oxygen is extracted from the oxide semiconductor film 106, so that the resistance of the oxide semiconductor 106 is reduced in this portion, and the intermediate resistance region 1062 is formed in this portion of the oxide semiconductor film 106. The intermediate resistance region 1062 suppresses generation of hot carriers and stabilizes characteristics of the oxide semiconductor TFT.

In the regions 1063 and 1064 in which the drain electrode 107 or the source electrode 108 is laminated on the oxide semiconductor 106, since a large amount of oxygen is removed from the oxide semiconductors 1063 and 1064 by the drain electrode 107 or the source electrode 108 which is a metal, regions of the oxide semiconductors 1063 and 1064 have conductivity. On the other hand, a high resistance is maintained in the channel region 1061 of the oxide semiconductor since oxygen is maintained in the channel region 1061 due to presence of the titanium nitride film 10; thus, characteristics of the TFT can be maintained. Therefore, reliability of the oxide semiconductor TFT can be maintained.

On the right side of FIG. 4, a titanium oxide film 10 is also formed on the capacitor wiring 120 formed simultaneously with the gate electrode 104. The titanium oxide film 10 is, however, conductive, thus, conduction between the capacitor wiring 120 and the capacitor electrode 122 is not impaired.

Figure 6:
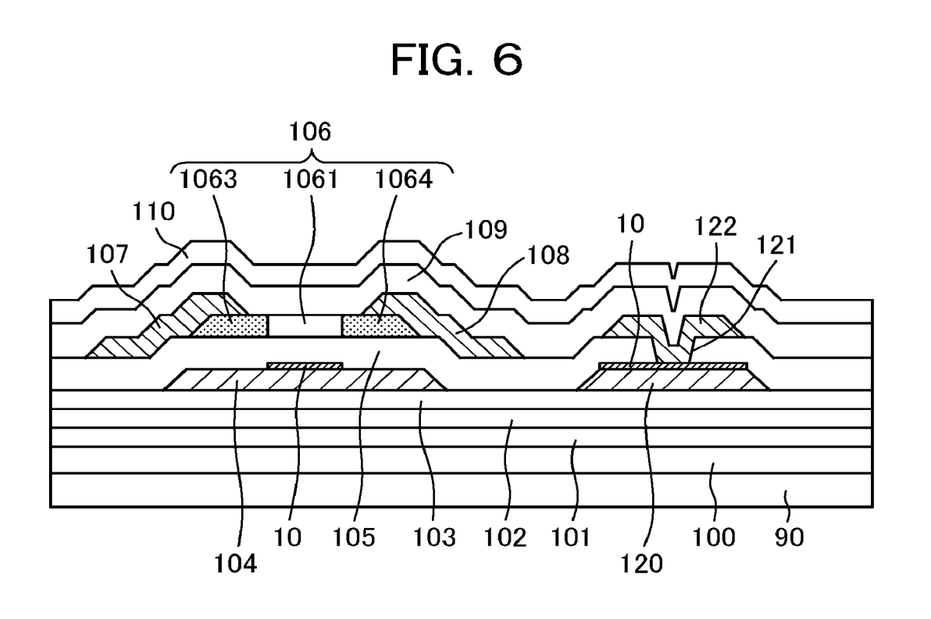
FIG. 6 is a cross sectional view of the structure of a TFT and its vicinity according to a second example of embodiment 1.

FIG. 6 is a cross-sectional view showing a second example of embodiment 1. FIG. 6 is different from FIG. 4 in that the titanium nitride film 10 formed on the gate electrode 104 is formed only in a portion corresponding to the channel region 1061 of the oxide semiconductor 106. In other words, in the channel region 1061 of the oxide semiconductor 106, oxygen is prevented from being removed due to the titanium nitride film 10, so that high resistance can be maintained. However, since oxygen is extracted from the oxide semiconductor 106 corresponding to the portion where the titanium nitride film 10 is not formed on the gate electrode 104; consequently, a resistance of the oxide semiconductor 106 decreases. Incidentally, in a region of the oxide semiconductor 106 in which the drain electrode 107 and the source electrode 108 are stacked, i e., the drain region 1063 and the source region 1064, oxygen is extracted by the drain electrode 107 and the source electrode 108 in a large amount, thus a resistance of the drain region 1063 and a resistance of the source region 1064 decrease greatly. On the other hand, in a region between the channel region 1061 and a region the drain region 1063 or a region between the channel region 1061 and the source region 1064, oxygen is extracted only by gate electrode 104 via gate insulating film 105; thus a resistance of the oxide semiconductor 106 does not decrease in large amount compared with the drain region 1063 and the source region 1064. Therefore, an intermediate resistance region (LDD region) is formed also in the configuration of FIG. 6. Accordingly, in the configuration of FIG. 6, an oxide semiconductor TFT with stable characteristics can be formed.

Figure 7:
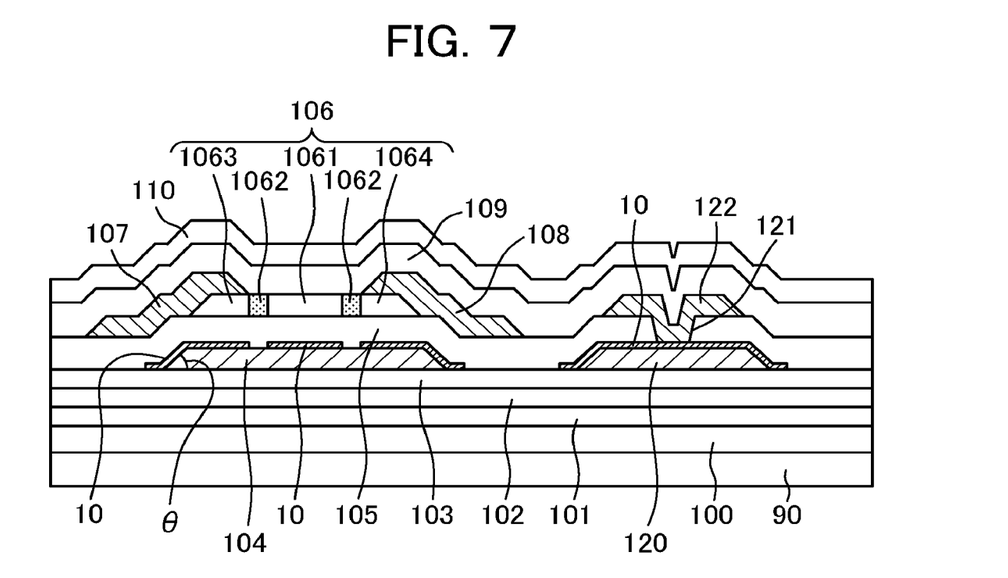
FIG. 7 is a cross sectional view of the structure of a TFT and its vicinity according to a third example of embodiment 1.

FIG. 7 is a cross-sectional view showing a third example of embodiment 1. FIG. 7 is different from FIG. 4 in embodiment 1 in that a titanium nitride film 10 is also formed on the side surface of the gate electrode 104. Thus, absorption of oxygen from the oxide semiconductor 106 by the gate electrode 104 can be more efficiently prevented.

In order to form the titanium nitride film 10 on the side surface of the gate electrode 104, it is preferable that the taper of the side surface of the gate electrode 104 is not steep. For this purpose, the taper angle θ of the side surface of the gate electrode 104 is preferably between 40 and 60 degrees.

Figure 8:
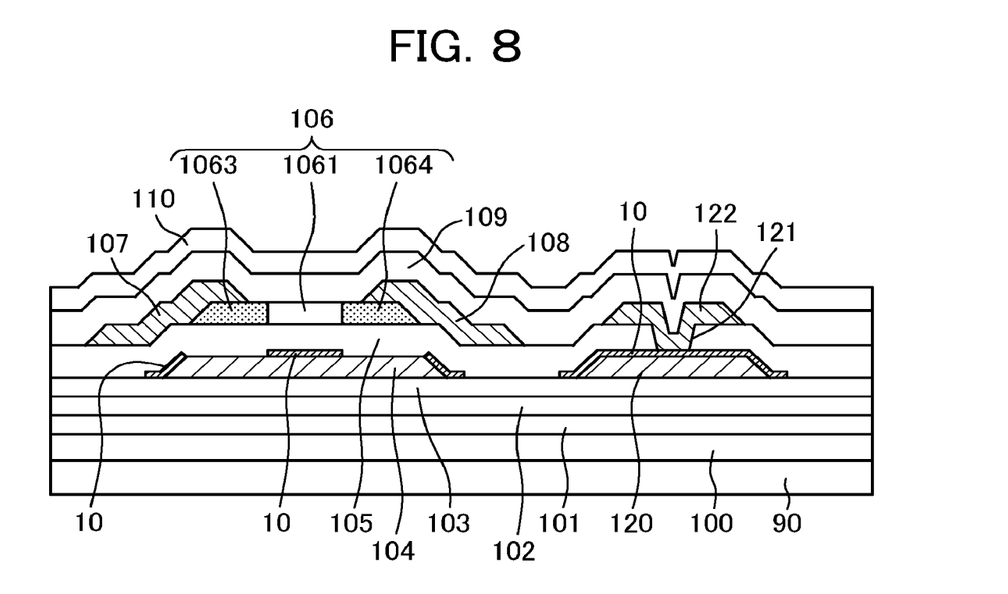
FIG. 8 is a cross sectional view of the structure of a TFT and its vicinity according to a fourth example of embodiment 1.

FIG. 8 is a cross-sectional view showing a fourth example of embodiment 1. FIG. 8 is different from FIG. 6 in the second example in that a titanium nitride film 10 is also formed on the side surface of the gate electrode 104. Thus, absorption of oxygen from the oxide semiconductor 106 by the gate electrode 104 can be more efficiently prevented. Other configurations of FIG. 8 are similar to those described with reference to FIGS. 6 and 7.

Although, in the above description, titanium nitride is used as the metal nitride film 10, the metal nitride film 10 is not limited thereto. For example, tantalum nitride (TaNx) or the like can be used.

Embodiment 2

Figure 9:
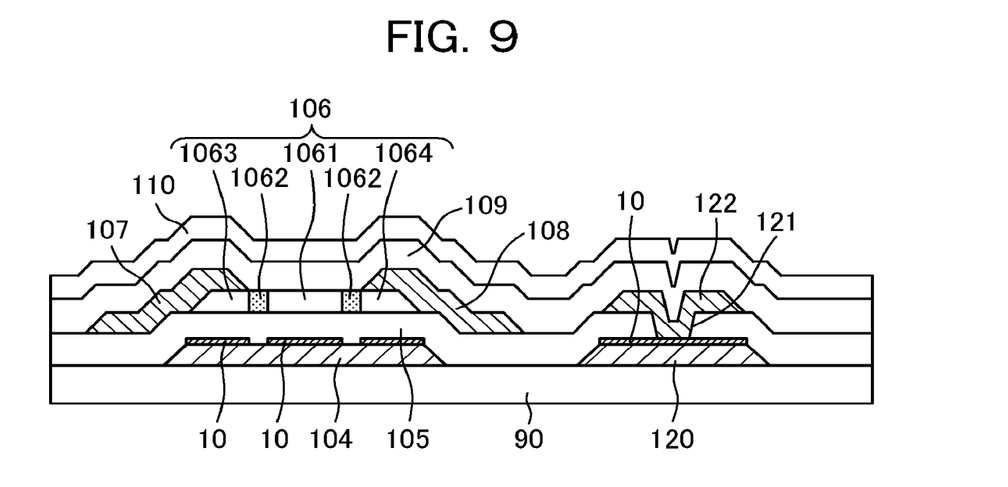
FIG. 9 is a cross sectional view of the structure of a TFT and its vicinity according to a first example of embodiment 2.

The structure of embodiment 2 is different from that of the embodiment 1 in that the substrate of the liquid crystal display device is not a polyimide substrate 100 but a glass substrate 90. FIG. 9 is a cross-sectional view showing a first example of embodiment 2. FIG. 9 is different from FIG. 4 of embodiment 1 in that the polyimide substrate and the first to third base films do not exist, and a gate electrode 104 is directly formed on the glass substrate 90.

Generally, a non-alkali glass is used as the glass substrate 90. The influence of impurities from the glass substrate 90 on the oxide semiconductor 106 is stopped by the gate electrode 104, which is metal. However, if there is a possibility that the influence of impurities from the glass substrate 90 remains, the base films of 101, 102 and 103 as described in FIG. 3 may be formed. Since the other layer structure in FIG. 9 is similar to that in FIG. 4, description thereof will be omitted.

Figure 10:
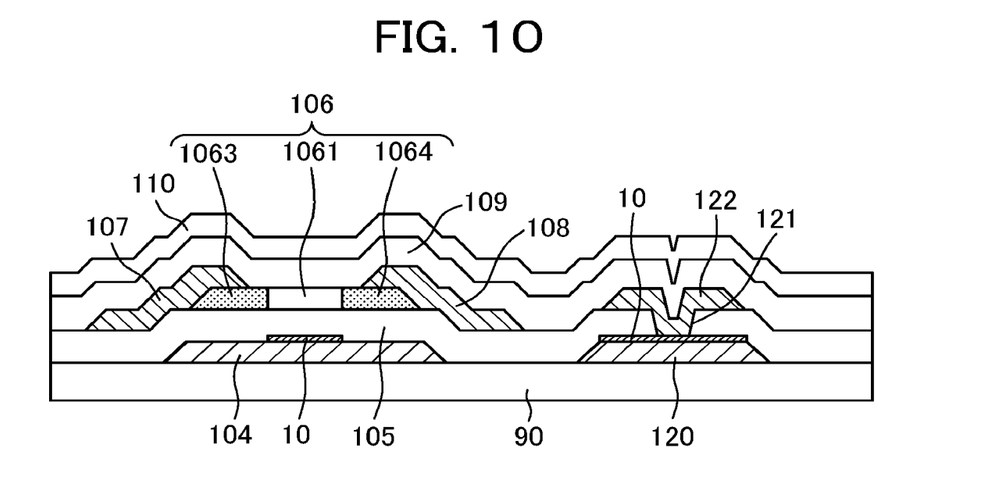
FIG. 10 is a cross sectional view of the structure of a TFT and its vicinity according to a second example of embodiment 2.

FIG. 10 is a cross-sectional view showing a second example of embodiment 2. FIG. 10 is different from FIG. 6 in embodiment 1 in that the polyimide substrate and the first to third base films do not exist, and a gate electrode 104 is directly formed on the glass substrate 90. Since this difference is the same as described in FIG. 9, a description thereof will be omitted.

Figure 11:
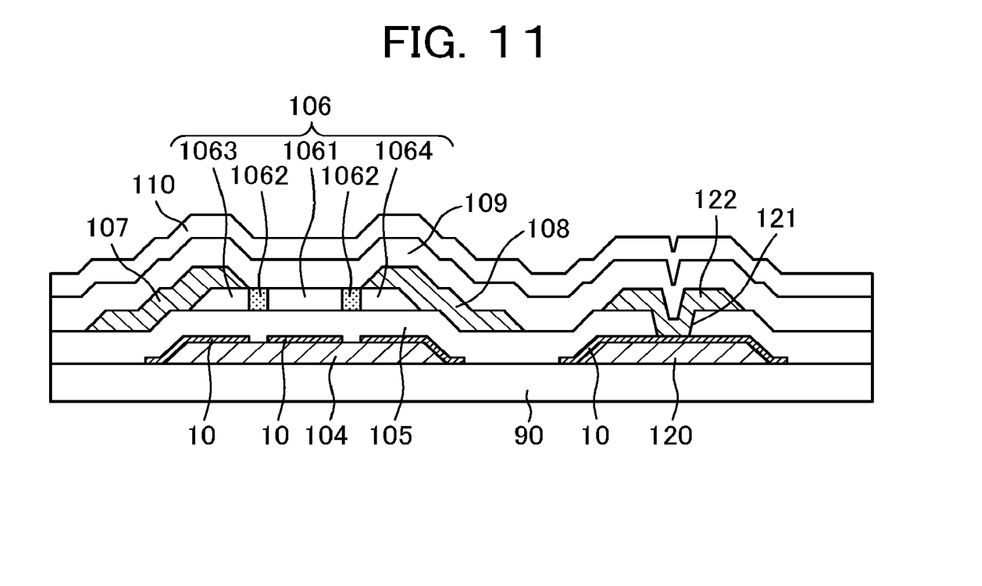
FIG. 11 is a cross sectional view of the structure of a TFT and its vicinity according to a third example of embodiment 2.

FIG. 11 is a cross-sectional view showing a third example of embodiment 2. FIG. 11 is different from FIG. 7 of embodiment 1 in that the polyimide substrate and the first to third base films do not exist, and a gate electrode 104 is directly formed on the glass substrate 90. Since this difference is the same as described in FIG. 9, a description thereof is omitted.

Figure 12:
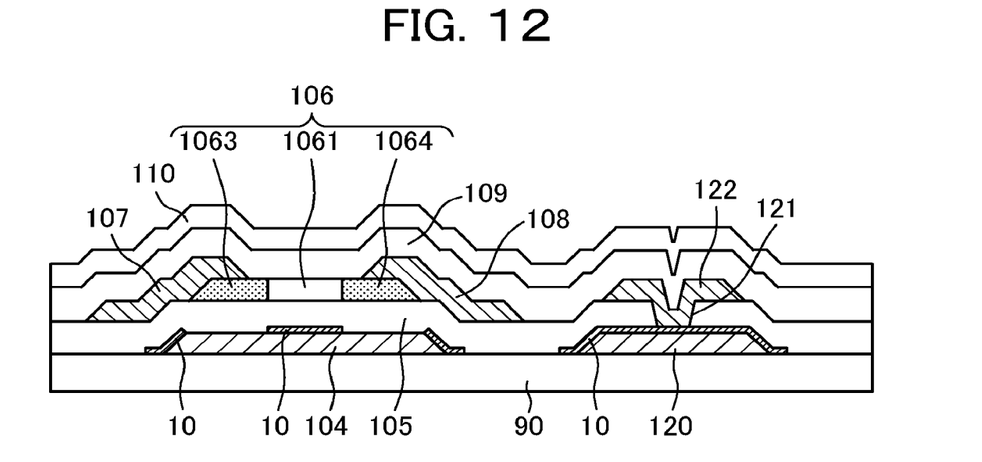
FIG. 12 is a cross sectional view of the structure of a TFT and its vicinity according to a fourth example of embodiment 2.

FIG. 12 is a cross-sectional view showing a fourth example of embodiment 2. FIG. 12 is different from FIG. 8 of embodiment 1 in that the polyimide substrate and the first to third base films do not exist, and a gate electrode 104 is directly formed on the glass substrate 90. Since this difference is the same as described in FIG. 9, a description thereof is omitted.

Embodiment 3

Figure 13:
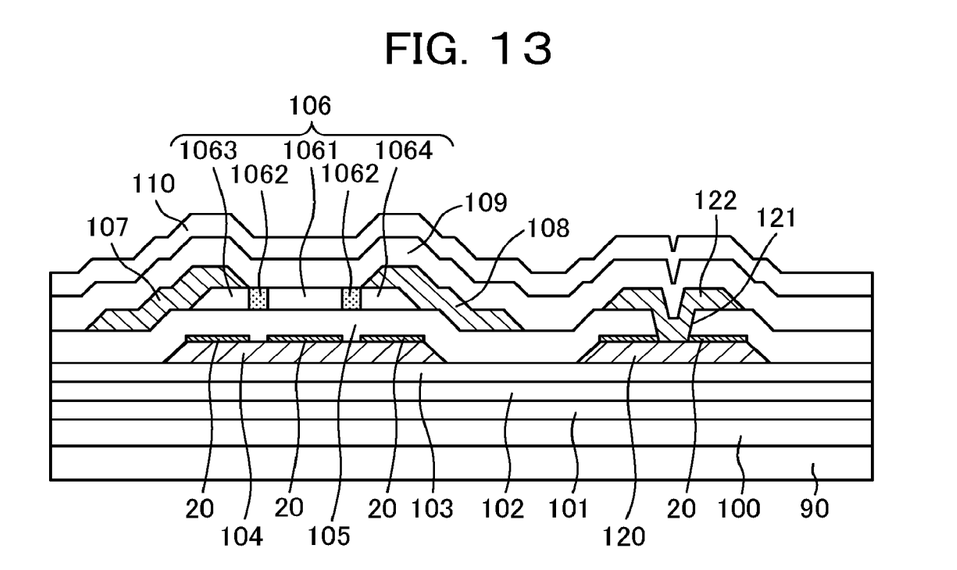
FIG. 13 is a cross sectional view of the structure of a TFT and its vicinity according to a first example of embodiment 3.

FIG. 13 is a cross-sectional view showing a first example of embodiment 3. FIG. 13 is different from FIG. 4 of embodiment 1 in that a metal oxide film 20 is formed on the gate electrode 104 instead of a metal nitride film. The metal oxide film 20 can also prevent the gate electrode 104 from extracting oxygen from the oxide semiconductor 106. In other words, the action of the metal oxide film 20 is the same as that of the metal nitride film in FIG. 4 of embodiment 1.

Examples of the type of the metal oxide 20 include various oxide semiconductors described above, metal oxide conductors such as ITO, and insulating metal oxides such as alumina (AlOx). Examples of other metal oxide conductors include AZO (Aluminum doped Zinc Oxide) and IZO (Indium Zinc Oxide). As in the case of the metal nitride film, the thickness of the metal oxide film 20 is preferably 5 to 30 nm.

Since the metal oxide may be an insulator, a through hole is formed in a portion where the capacitor wiring 120 is connected to the capacitor electrode 121 in the metal oxide film 20 formed on the capacitor wiring 120 in FIG. 13. Other configurations and operations of FIG. 13 are similar to those described in FIG. 4 of embodiment 1, and therefore, a description thereof is omitted.

Figure 14:
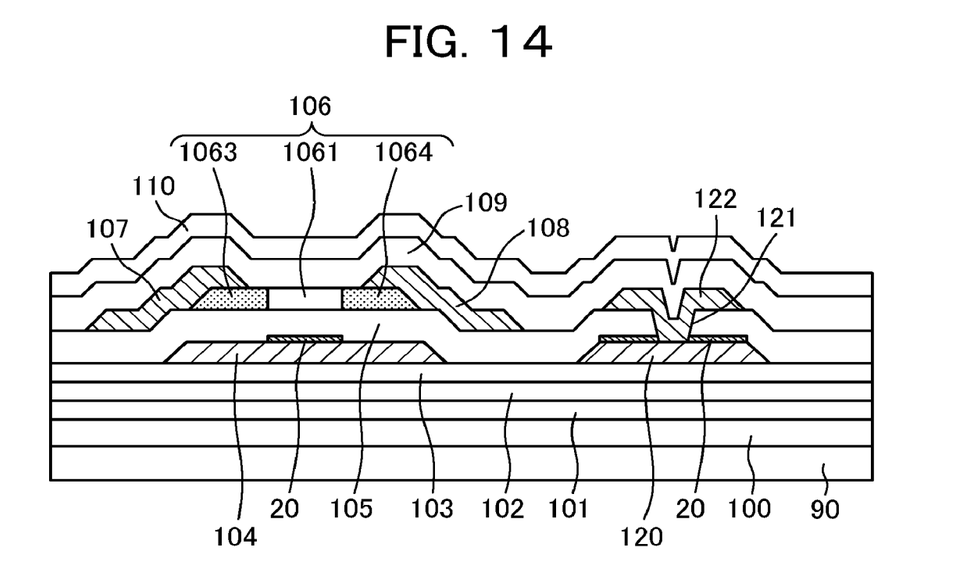
FIG. 14 is a cross sectional view of the structure of a TFT and its vicinity according to a second example of embodiment 3.

FIG. 14 is a cross-sectional view showing a second example of embodiment 3. FIG. 14 differs from FIG. 6 of embodiment 1 in that a metal oxide film 20 is formed instead of a metal nitride film. Since the action of the metal oxide film 20 in FIG. 14 is the same as that of the metal nitride film 20 in FIG. 6, therefore, a description thereof is omitted.

Figure 15:
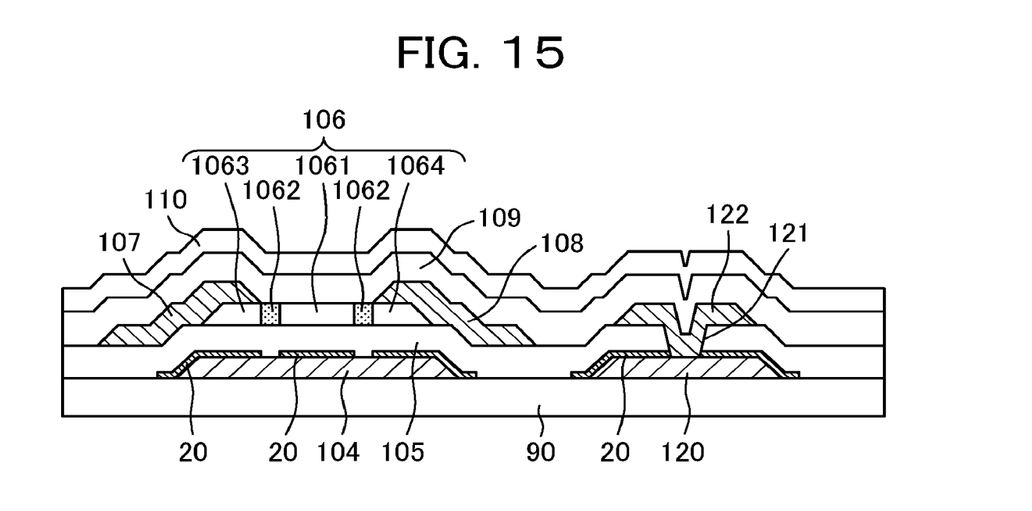
FIG. 15 is a cross sectional view of the structure of a TFT and its vicinity according to a third example of embodiment 3.

FIG. 15 is a cross-sectional view showing a third example of embodiment 3. In FIG. 15, a side surface of the gate electrode 104 is covered with a metal oxide film 20. FIG. 15 differs from FIG. 7 of embodiment 1 in that a metal oxide film 20 is formed instead of a metal nitride film. Since the action of the metal oxide film 20 in FIG. 15 is the same as that of the metal nitride film 10 in FIG. 7, a description thereof is omitted.

Figure 16:
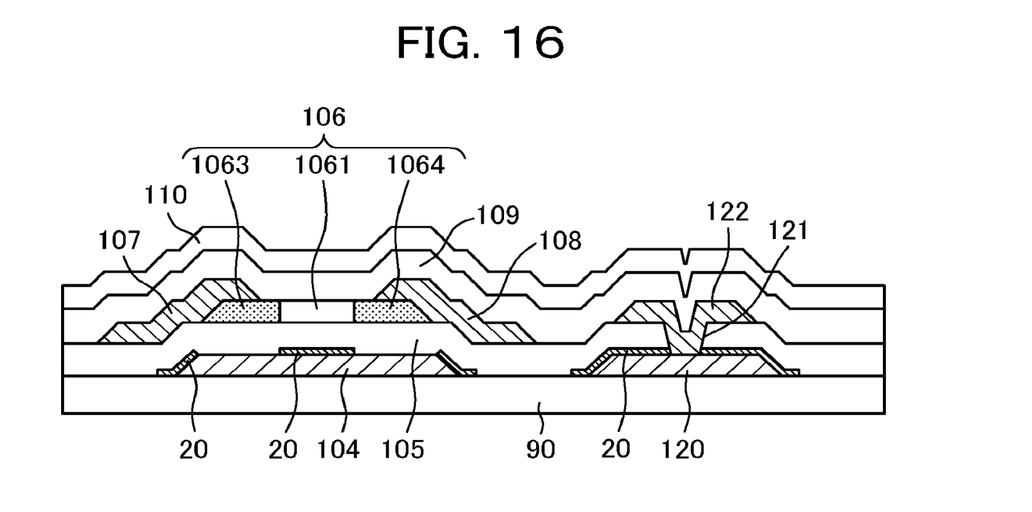
FIG. 16 is a cross sectional view of the structure of a TFT and its vicinity according to a fourth example of embodiment 3.

FIG. 16 is a cross-sectional view showing a fourth example of embodiment 3. In FIG. 6, the side surface of the gate electrode 104 is covered with a metal oxide film 20. FIG. 16 is different from FIG. 8 of embodiment 1 in that the metal oxide film 20 is formed instead of the metal nitride 10. Since the action of the metal oxide film 20 in FIG. 16 is the same as that of the metal nitride film 10 in FIG. 8, a description thereof is omitted.

Embodiment 4

Figure 17:
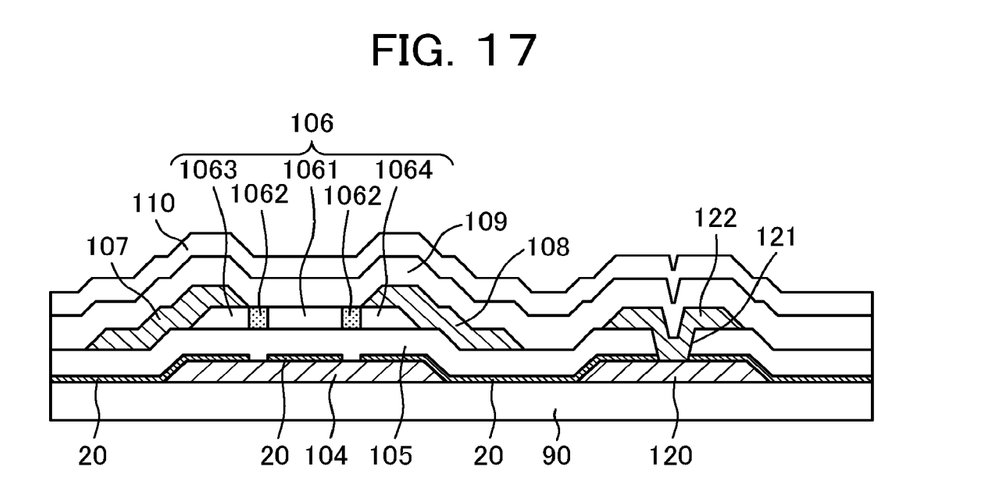
FIG. 17 is a cross sectional view of the structure of a TFT and its vicinity according to a first example of embodiment 4.

FIG. 17 is a cross-sectional view showing a first example of embodiment 4. In FIG. 17, a metal oxide film 20 which is an insulating film is formed on the gate electrode 104. As the metal oxide film 20 which is an insulating film, for example, an alumina (AlOx) film can be mentioned. The thickness of the alumina (AlOx) film 30 is 5 to 30 nm as in the case of the metal nitride film in embodiment 1.

The action of the alumina (AlOx) film 30 is similar to that of the metal nitride film described in FIG. 4 or FIG. 7 of embodiment 1. Since the alumina (AlOx) film 30 is an insulating film, it can cover not only the gate electrode 104 or the capacitor wiring 120 but also the entire surface of the substrate. Thus, the alumina (AlOx) film 30 can be made to act as a block film for blocking impurities from the glass substrate 90, the polyimide substrate 100, and the like.

Figure 18:
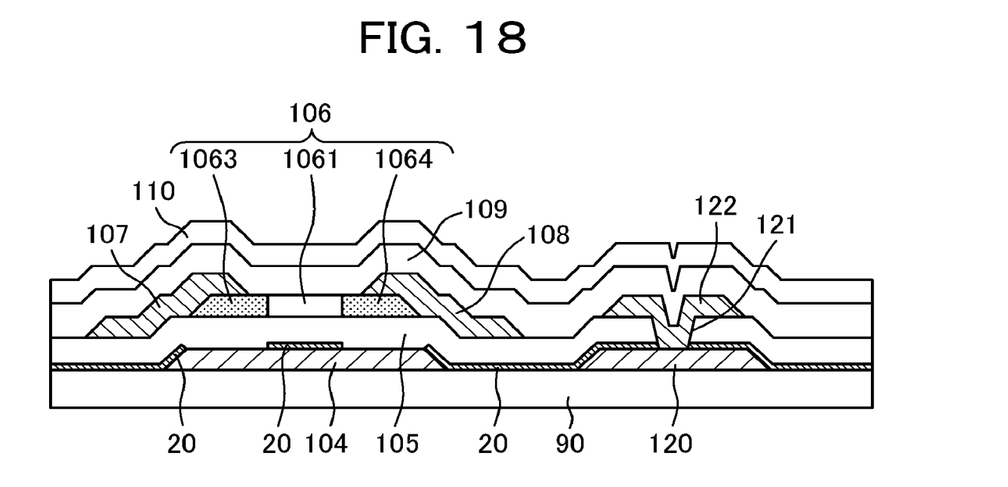
FIG. 18 is a cross sectional view of the structure of a TFT and its vicinity according to a second example of embodiment 4.

FIG. 18 is a cross-sectional view showing a second example of embodiment 4. FIG. 18 differs from FIG. 12 of embodiment 2 in that an alumina (AlOx) film 30 is formed on the gate electrode 104 instead of a metal nitride film, and an alumina (AlOx) film 30 is formed not only on the gate electrode 104 and the capacitor wiring 120 but also on the entire surface of the substrate. The action of the alumina (AlOx) film 30 is the same as that described in FIG. 17 and the like, and therefore, a description thereof is omitted.

As described above, according to the present invention, it is possible to effectively prevent oxygen from being lost from the oxide semiconductor film and to form a stable oxide semiconductor TFT.

Note that, although an example in which an oxide semiconductor is applied to a liquid crystal display device has been described above, the present invention can be applied to an apparatus including another display device such as an organic EL display device, a two dimensional light sensor, or the like.

What is claimed is:

1. A semiconductor device having a TFT, in which a gate insulating film is formed on a gate electrode, and an oxide semiconductor film is formed on the gate insulating film;

the oxide semiconductor film including a channel region, a drain region, and a source region, wherein a metal nitride film is formed on a top surface of the gate electrode in an opposing portion to the channel region in a plan view, the metal nitride film is not formed at a part of the top surface of the gate electrode, the oxide semiconductor film comprises an intermediate resistance region between the channel region and the drain region and between the channel region and the source region of the oxide semiconductor film, the metal nitride film is not formed at places of the top surface of the gate electrode corresponding to the intermediate resistance region, and the metal nitride film is formed at places of the top surface of the gate electrode corresponding to the drain region and the source region of the oxide semiconductor film.

2. The semiconductor device according to claim 1, wherein the metal nitride film is formed on a side surface of the gate electrode.

3. The semiconductor device according to claim 1, wherein the metal nitride film is a titanium nitride (TiN) film.

4. The semiconductor device according to claim 1, wherein the gate electrode is a laminated film of aluminum (Al) layer over coated by titanium (Ti) layer.

5. A semiconductor device having a TFT, in which a gate insulating film is formed on a gate electrode, and an oxide semiconductor film is formed on the gate insulating film;

the oxide semiconductor film including a channel region, a drain region, and a source region, wherein a metal oxide film is formed on a top surface of the gate electrode in an opposing portion to the channel region in a plan view, the metal oxide film is not formed at a part of the top surface of the gate electrode, the oxide semiconductor film comprises an intermediate resistance region between the channel region and the drain region and between the channel region and the source region of the oxide semiconductor film, the metal oxide film is not formed at places of the top surface of the gate electrode corresponding to the intermediate resistance region, and the metal oxide is formed at places of the top surface of the gate electrode corresponding to the drain region and the source region of the oxide semiconductor film.

6. The semiconductor device according to claim 5, wherein the metal oxide film is formed on a side surface of the gate electrode.

7. The semiconductor device according to claim 5, wherein the metal oxide film is a conductive metal oxide film.

8. The semiconductor device according to claim 5, wherein the metal oxide film is an ITO film.

9. The semiconductor device according to claim 5, wherein the metal oxide film is another oxide semiconductor film formed separately from the oxide semiconductor film.

10. A semiconductor device having a TFT, in which a gate insulating film is formed on a gate electrode, and an oxide semiconductor film is formed on the gate insulating film;

the oxide semiconductor film including a channel region, a drain region, and a source region, wherein an insulating metal oxide film is formed on a top surface of the gate electrode in an opposing portion to the channel region in a plan view, the metal oxide film is not formed at a part of the top surface of the gate electrode, the oxide semiconductor film comprises an intermediate resistance region between the channel region and the drain region and between the channel region and the source region of the oxide semiconductor film, the insulating metal oxide film is not formed at places of the top surface of the gate electrode corresponding to the intermediate resistance region, and the insulating metal oxide film is formed at places of the top surface of the gate electrode corresponding to the drain region and the source region of the oxide semiconductor film.

11. The semiconductor device according to claim 10, wherein the insulating metal oxide film is formed on a side surface of the gate electrode.

12. The semiconductor device according to claim 10, wherein the metal oxide film is an alumina (AlOx) film.

* * * * *